United States Patent
Maenishi et al.

(10) Patent No.: US 10,602,618 B2
(45) Date of Patent: Mar. 24, 2020

(54) PARTS MOUNTING SYSTEM AND PARTS MOUNTING METHOD

(71) Applicant: Panasonic Corporation, Osaka (JP)

(72) Inventors: Yasuhiro Maenishi, Yamanashi (JP); Nobuaki Sakamoto, Yamanashi (JP); Shunsuke Higashi, Yamanashi (JP); Hiroshi Ando, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 720 days.

(21) Appl. No.: 14/454,970

(22) Filed: Aug. 8, 2014

(65) Prior Publication Data

US 2015/0074994 A1    Mar. 19, 2015

(30) Foreign Application Priority Data

Sep. 19, 2013 (JP) .................. 2013-193818

(51) Int. Cl.
*H05K 3/32* (2006.01)
*H05K 13/04* (2006.01)
(Continued)

(52) U.S. Cl.
CPC ............ *H05K 3/30* (2013.01); *Y10T 29/4913* (2015.01); *Y10T 29/53178* (2015.01)

(58) Field of Classification Search
CPC ............... H05K 13/08; H05K 13/0023; H05K 13/04–0495; H05K 3/30;
(Continued)

(56) References Cited

U.S. PATENT DOCUMENTS 4,888,473 A * 12/1989 Rossi .................. G03F 7/70541
235/376
5,283,943 A * 2/1994 Aguayo ........... G05B 19/41805
29/701
(Continued)

FOREIGN PATENT DOCUMENTS

JP     2000-261197 A    9/2000
JP     2003-283188 A   10/2003
(Continued)

OTHER PUBLICATIONS

Office Action for Japanese Application No. 2013-193818 dated Jan. 26, 2016.

*Primary Examiner* — Peter Dungba Vo
*Assistant Examiner* — Kaying Kue
(74) *Attorney, Agent, or Firm* — Pearne & Gordon LLP (57) ABSTRACT

A parts mounting system includes: a parts checking section that detects parts information which is identification information applied to the electronic parts and includes a parts code for specifying parts of the electronic parts and a parts maker code for specifying the parts maker and checks the detected parts information with parts information previously registered in a storing part; and a parts data generation section that, when the detected parts information is unregistered parts information in which the parts code is stored in the storing part and the parts maker code of the parts code is not stored in the storing part, generates parts data of the electronic parts relating to the unregistered parts information based on previously registered parts data having the same parts code.

6 Claims, 10 Drawing Sheets

(51) Int. Cl.
*H05K 13/08* (2006.01)
*H05K 3/30* (2006.01)

(58) Field of Classification Search
CPC .......... Y10T 29/4913–49144; Y10T 29/53174–53183; Y10T 29/53191; G05B 19/4183; H01L 22/14; H01L 22/10; B29C 45/76
USPC .......... 29/832–842, 701, 743, 729–741, 759, 29/742, 744, 757
See application file for complete search history.

(56) References Cited

U.S. PATENT DOCUMENTS

| | | | | |
|---|---|---|---|---|
| 5,353,234 A | * | 10/1994 | Takigami | G06F 17/5068 716/102 |
| 5,781,447 A | * | 7/1998 | Gerdes | H05K 13/0882 716/103 |
| 5,930,140 A | * | 7/1999 | Asai | H05K 13/02 700/121 |
| 6,408,253 B2 | * | 6/2002 | Rosenberg | G01B 21/04 702/150 |
| 6,531,026 B1 | * | 3/2003 | Takeichi | H01L 21/563 156/152 |
| 6,718,629 B1 | * | 4/2004 | Stanzl | H05K 13/0882 29/832 |
| 6,778,878 B1 | * | 8/2004 | Kou | H05K 13/087 700/221 |
| 6,877,220 B1 | * | 4/2005 | Kuribayashi | H05K 13/0417 29/832 |
| 6,918,730 B2 | * | 7/2005 | Kawai | H05K 13/0417 414/183 |
| 7,290,701 B2 | * | 11/2007 | Kou | H05K 13/084 235/376 |
| 7,356,176 B2 | * | 4/2008 | Fujii | G01N 21/8851 382/141 |
| 7,551,084 B2 | * | 6/2009 | Gunther | G05B 19/12 340/10.1 |
| 7,562,350 B2 | * | 7/2009 | Watanabe | G01R 31/31707 716/128 |
| 7,571,539 B2 | | 8/2009 | Maenishi et al. | |
| 2002/0194729 A1 | * | 12/2002 | Kuribayashi | H05K 13/0815 29/834 |
| 2003/0078676 A1 | * | 4/2003 | Kuribayashi | G05B 19/4097 700/1 |
| 2005/0190956 A1 | * | 9/2005 | Fujii | G01N 21/8851 382/141 |
| 2006/0125607 A1 | * | 6/2006 | Gunther | G05B 19/12 340/10.52 |
| 2006/0207089 A1 | * | 9/2006 | Maenishi | H05K 13/084 29/832 |
| 2007/0208449 A1 | * | 9/2007 | Konrath | H05K 13/0812 700/121 |
| 2008/0217394 A1 | * | 9/2008 | Okada | H05K 13/086 235/375 |
| 2009/0077106 A1 | * | 3/2009 | Kawase | H05K 13/085 |
| 2009/0088888 A1 | * | 4/2009 | Kawase | H05K 13/0813 700/121 |
| 2009/0259333 A1 | * | 10/2009 | Yano | G05B 19/41805 700/121 |
| 2010/0142799 A1 | * | 6/2010 | Minamide | H05K 13/0813 382/145 |
| 2010/0325860 A1 | * | 12/2010 | Maenishi | H05K 13/085 29/407.01 |
| 2012/0185194 A1 | * | 7/2012 | Matsushita | G05B 19/41875 702/83 |
| 2013/0182942 A1 | * | 7/2013 | Fujii | G01N 21/95684 382/150 |
| 2013/0202018 A1 | * | 8/2013 | Li | H04B 3/542 375/222 |

FOREIGN PATENT DOCUMENTS

| | | |
|---|---|---|
| JP | 2005-101576 A | 4/2005 |
| JP | 2007-317905 A | 12/2007 |
| JP | 2010-147124 A | 7/2010 |

* cited by examiner

PARTS MOUNTING SYSTEM AND PARTS MOUNTING METHOD

CROSS REFERENCE TO RELATED APPLICATION(S)

The present disclosure relates to the subject matters contained in Japanese Patent Application No. 2013-193818 filed on Sep. 19, 2013, which are incorporated herein by reference in its entirety.

FIELD

An exemplary embodiment of the invention relates to a parts mounting system and a parts mounting method for mounting electronic parts on a board.

BACKGROUND

A parts mounting system which mounts electronic parts on a board to manufacture a mounting board includes a parts storage area where the electronic parts supplied form a parts maker are kept and a parts mounting area where a mounting work is carried out that the electronic parts put out from the parts storage area are mounted on the board. In a parts loading and unloading work of the electronic parts in the parts storage area and the parts mounting work in the parts mounting area, parts data which specifies various kinds of data such as attributes or control parameters of the electronic parts as objects to be mounted for each of the parts is referred to (for instance, see Patent Literatures 1 and 2 shown below).

In examples of the related art disclosed in the patent literatures, data relating to operation parameters in a mounting head for moving and mounting the electronic parts or a control shaft such as an XY table which positions the board or relating to kinds of suction nozzles to be used is stored as a parts data library in which the data is collected for each of the parts. In the parts data library, various kinds of data are respectively tied to names of the parts which specify the parts. When the data is referred to, the data corresponding to a designated name of a part is read. As the name of the part, a model number of the electronic part or the like is used that is selected from the parts standard based on a specification required in a stage of design.

Patent Literature 1 is JP-A-2000-261197. Patent Literature 2 is JP-A-2003-283188.

SUMMARY

In a production site for mounting parts, even in the same parts, the electronic parts the parts makers of which are different may be possibly sometimes mixed and used owing to various reasons such as a convenience for supplying the parts. Accordingly, for the electronic parts the data of the parts of which is the same and the parts makers of which are different, since dimensions and colors of the parts are subtly different, the parts data needs to be respectively previously prepared. Further, in the production site for mounting the parts, the parts makers of the electronic parts may be supposed to be suddenly changed or newly adopted. However, when it takes much time or labor to prepare the parts data or a preparation itself is forgotten, a situation may arise that equipment cannot be operated until a countermeasure for the above-described matter is completed. Thus, capacity utilization may be deteriorated.

Thus, the exemplary embodiment of the invention aims to provide a parts mounting system and a parts mounting method which can rapidly and assuredly deal with a change or a new adoption of a parts maker even in a production site for mounting parts where electronic parts which are the same parts and the parts makers of which are different are mixed.

According to the embodiment of the present invention, there is provided a parts mounting system that mounts electronic parts supplied from a plurality of parts makers on a board by referring to previously stored parts data, the system including: a parts check processing section that, in a loading work of the electronic parts or a parts mounting work by a parts mounting device, detects parts information which is identification information applied to an electronic part and includes a parts code for specifying a part of the electronic part and a parts maker code for specifying a parts maker of the electronic part and checks the detected parts information with parts information previously registered in a storing part; and a parts data generation section that, when the detected parts information is unregistered parts information in which the parts code is stored in the storing part and the parts maker code of the parts code is not stored in the storing part, generates parts data of the electronic part relating to the unregistered parts information based on previously registered parts data having the same parts code.

According to the embodiment of the present invention, there is provided a parts mounting method that mounts electronic parts supplied from a plurality of parts makers on a board by referring to previously set parts data, the parts mounting method including: in a loading work of the electronic parts or a parts mounting work by a parts mounting device, detecting parts information which is identification information applied to an electronic part and includes a parts code for specifying a part of the electronic part and a parts maker code for specifying a parts maker of the electronic part and checking the detected parts information with the parts information previously registered and stored in a storing part; when the detected parts information is unregistered parts information in which the parts code is stored in the storing part and the parts maker code of the parts code is not stored in the storing part, generating parts data of the electronic part relating to the unregistered parts information based on previously registered parts data having the same parts code; and mounting the electronic parts on the board with the parts mounting device to which the previously registered parts data and the generated parts data are applied.

According to the embodiment of the present invention, when the parts information detected in the parts check processing that the parts information which is the identification information applied to an electronic parts and includes the parts code for specifying apart of the electronic part and the parts maker code for specifying the parts maker of the electronic part is detected to check the detected parts information with the parts information previously stored in the storing part is unregistered parts information the parts code of which is already registered and the parts maker code of the parts code of which is not registered, the parts data of the electronic part relating to the unregistered parts information is generated based on the previously registered parts data which has the same parts code for application of data. Thus, even if the electronic parts having the same parts name and supplied from different parts makers are included as the objects to be mounted, when the new electronic parts supplied from the different parts maker are used, the previously registered parts data having the same parts code is used to automatically generate the parts data. Accordingly, the parts data does not need to be previously prepared, so that the change or the new adoption of the parts maker can be rapidly and assuredly dealt with.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Now, an exemplary embodiment of the present invention will be described below by referring to the drawings. Initially, by referring to FIG. 1, a structure of a parts mounting system 1 will be described below. The parts mounting system 1 includes a mounting area 3 having a mounting line 3a in which a plurality of mounting machines (parts mounting devices) 10 are connected together and a host system 2 which controls the mounting area 3. With this structure, a function is provided that electronic parts kept in parts storage areas provided in parallel with the mounting area 3 and supplied respectively to the mounting machines 10#1, 10#2 and 10#3 are mounted on a board to manufacture a mounting board.

Figure 2:
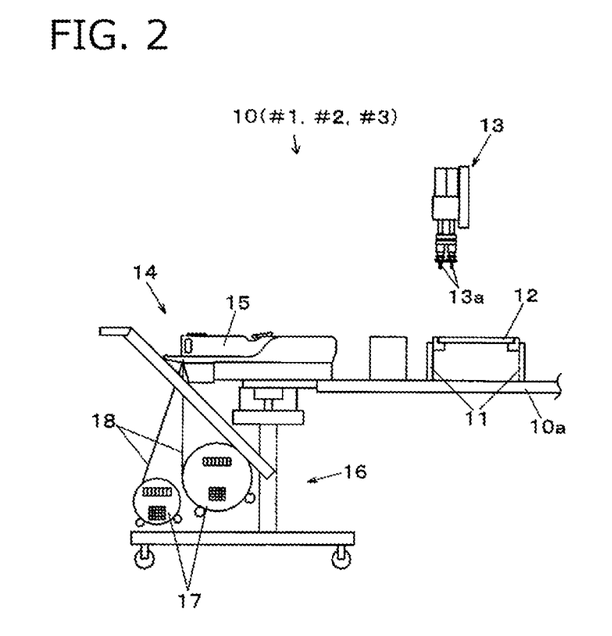
FIG. 2 is an explanatory view of a mounting machine (a parts mounting device) in the parts mounting system of the exemplary embodiment.

As shown in FIG. 2, in the mounting machines 10 (#1, #2 and #3) respectively, a parts feed part 14 which feeds the electronic parts is arranged in a side part of a board conveying mechanism 11 which is arranged on a base part 10a to convey aboard 12 as an object on which the electronic parts are mounted. The electronic parts taken out from the parts feed part 14 are moved and mounted on the board 12 by a suction nozzle 13a of a mounting head 13 which forms a parts mounting mechanism.

To a carriage 16 set in the parts feed part 14, a tape feeder 15 and tape reels 17 are attached. In the tape reels 17, carrier tapes 18 which hold the electronic parts are wound and accommodated. The tape feeder 15 pitch feeds the carrier tapes 18 pulled out from the tape reels 17 to supply the electronic parts to a parts taking out position by the mounting head 13. Thus, the electronic parts as objects to be mounted are delivered to the mounting head 13 of the parts mounting mechanism. Namely, the mounting machine 10 is provided with the tape feeder 15 which delivers the electronic parts held by the carrier tapes 18 to the parts mounting mechanism.

Figure 1:
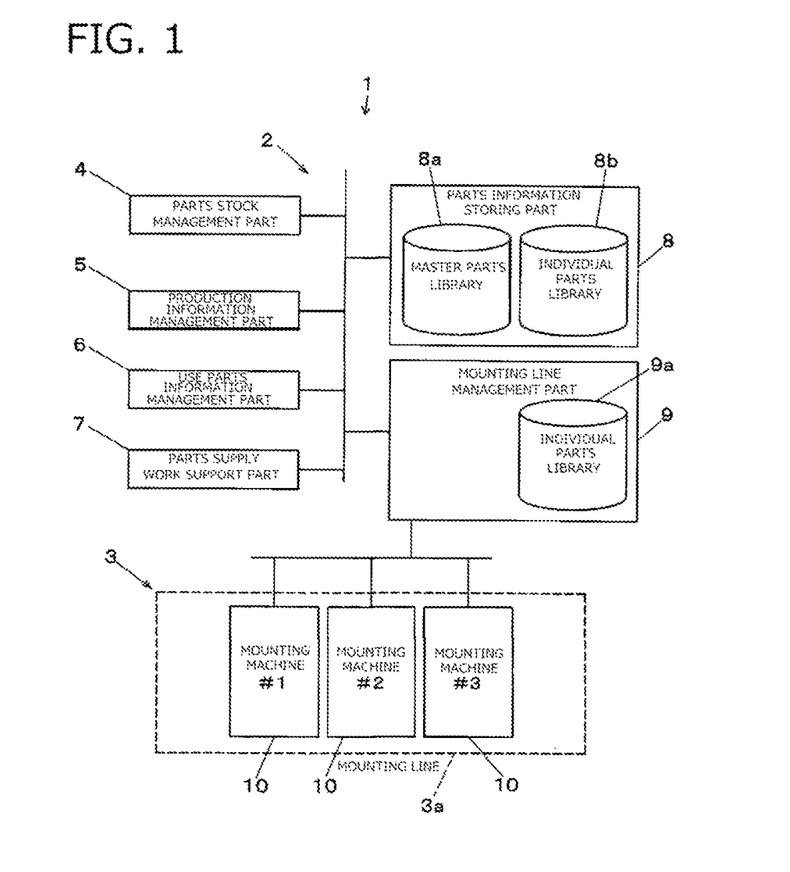
FIG. 1 is a block diagram showing a structure of a parts mounting system of an exemplary embodiment of the present invention.

The host system 2 includes a parts stock management part 4, a production information management part 5, a use parts information management part 6, a parts supply work support part 7, a parts information storing part 8 and a mounting line management part 9 which are mutually connected by a communication network. Further, the mounting line management part 9 is connected to the mounting machines 10 respectively forming the mounting line 3a. The parts stock management part 4 carries out a management based on a stock data base which records a stock state of the electronic parts kept in the parts storage areas. The production information management part 5 provides production programs used in parts mounting works carried out by the mounting machines 10.

The use parts information management part 6 has a function which controls or manages information of use parts which is used in the mounting line 3a, for instance, an ID code for specifying the tape reel 17 actually attached to the tape feeder 15 of the mounting machine 10. Based on a control or management function of the use parts information management part 6, in each of the mounting machines 10, it is grasped in a real time to what parts information the tape reel 17 corresponds and at which position where the feeder is arranged in the parts feed part 14, the tape reel 17 is attached. Thus, the electronic parts is specified which is actually taken out from the position where the feeder is arranged in a parts mounting operation.

In the present exemplary embodiment, use parts information is stored and managed in the use parts information management part 6 provided in the host system 2. However, the ID code for specifying the tape reel attached to the tape feeder 15 may be written and stored in a memory of a feeder controller incorporated in each tape feeder 15. Namely, the memory of each tape feeder 15 may be used as the use parts information management part. Further, the use parts information may be written and stored in a storage device of a control part provided in each of the mounting machines 10.

The parts supply work support part 7 has a function which supports a work processing to be carried out by an operator in a supply of parts that the tape reel 17 is replaced by a new tape reel in the parts feed part 14 of each of the mounting machines 10. Namely, identification information such as a bar code label (see a reel ID label 21 shown in FIG. 4) stuck to the tape reel 17 as an object to be exchanged for another tape reel and tied to parts information of the carrier tape 18 accommodated in the tape reel 17 is read to decide whether or not the detected parts information is the parts information of a correct electronic part based on the read result. Then, when the decided result shows that the parts information is error parts information, this result is reported. As a result, when the parts information is changed, the changed parts information is transmitted to the use parts information management part 6 and the changed contents are reflected on the use parts information.

The parts information storing part 8 stores information of a plurality of kinds of electronic parts as objects in the parts mounting work in the form of a data library. In the present exemplary embodiment, the parts data library includes a master parts library 8a created based on a master parts name and an individual parts library 8b which is created based on individual parts names which have the same functional parts as that of the master parts name and different venders (parts makers). The mounting line management part 9 controls or manages the parts mounting work by each of the mounting machines 10 in the mounting line 3a. In the mounting line management part 9, an individual parts library 9a having the same contents as those of the master parts library 8a stored in the parts information storing part 8. When the parts mounting work is carried out, parts data stored in a storing part (the individual parts libraries 9a and 8b or the master parts library Sa in the present exemplary embodiment) which stores the parts data library is referred to.

Figure 3A:
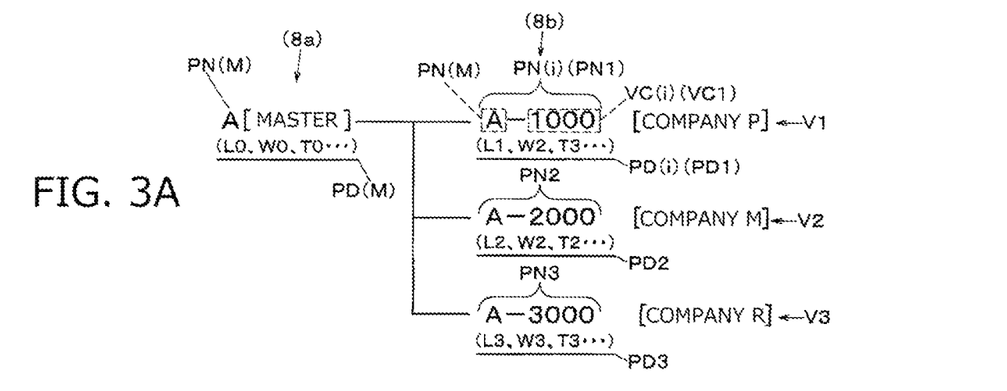
FIGS. 3A and 3B are explanatory views showing structures of data of a parts data library in the parts mounting system of the exemplary embodiment of the present invention.
Figure 3B:
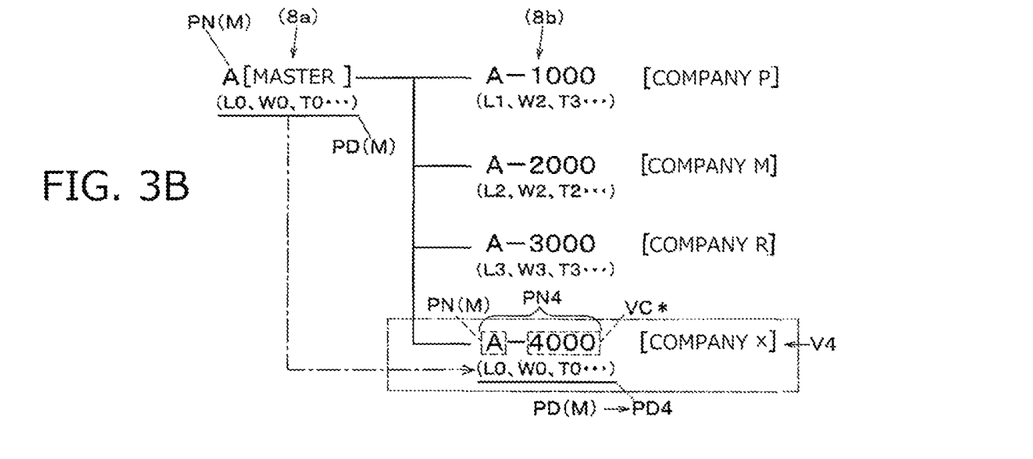

FIGS. 3A and 3B show data structures of the master parts library 8a and the individual parts library 8b. In FIG. 3A, the master parts library 8a has a structure in which a master parts name PN(M) (here, a symbol A) is corresponded to master parts data PD (M) which has, as its contents, a length size L0, a width size W0 and a thickness size T0 of the electronic part . . . and various kinds of operation parameters. The master parts name PN(M) indicates a parts code for specifying a part corresponding to a model number and a function of the electronic part. The electronic parts having the same master parts name PN (M) have compatibility in view of a function of parts. As the parts code, data of other form than the master parts name PN(M) may be used.

In the present exemplary embodiment, the parts data library has a layered structure in which the individual parts library 8b as a subordinate library is annexed to the master parts library 8a as a host library. Here, the subordinate library indicates the data library which manages as objects a plurality of kinds of electronic parts which have the master parts name PN (M) the same as the master parts name PN (M) shown in the master parts library 8a and individual parts data PD (i) (an attached character i designates a vender number) set that is generated separately from the master parts data PD (N) due to a difference of the vender (the parts maker).

Namely, the individual parts library 8b has a structure in which the master parts name PN(M) (the symbol A) the same as that of the master parts library 8a is combined with vender codes VC(i) (parts maker codes) which specify the parts makers of the electronic parts so that the individual parts data PD(i) including the length size, the width size and the thickness size of the electronic part as contents are respectively corresponded to each of a plurality of individual parts names PN(i) (the parts information) which are individually corresponded to the electronic parts. The individual parts names PN(i) indicate the identification information applied to the electronic parts and correspond to the parts information including the parts codes for specifying the parts of the electronic parts and the parts maker codes for specifying the parts makers of the electronic parts. As the parts information, data of other form than the individual parts name PN(i) may be used.

In an example shown in FIG. 3A, the electronic parts the master parts name PN (M) of which is A are supplied respectively from three kinds of venders of a "company P" V1, a "company M" V2 and a "company R" V3. Examples of the electronic parts, are shown, in which the vender codes VC1, VC2 and VC3 are respectively 1000, 2000 and 3000. Namely, to these electronic parts, the individual parts names PN1, PN2 and PN3 of A-1000, A-2000 and A-3000 are respectively applied. To the individual parts names PN1, PN2 and PN3, the individual parts data PD1 (L1, W2, T3 . . . ), PD2 (L2, W2, T2 . . . ) PD3 (L3, W3, T3 . . . ) which are generated separately from the master parts data PD(M) respectively correspond.

In the parts mounting work in the parts mounting system 1, when the mounting line management part 9 controls or manages respectively the mounting machines 10 of the mounting line 3a to carry out the mounting work, the mounting line management part 9 mounts the electronic parts having the individual parts names PN1, PN2 and PN3 which are respectively supplied from the plurality of venders as the parts makers including the "company P" V1, the "company N" V2 and the "company R" V3 on the board 12 (see FIG. 2) by firstly referring to the individual parts data PD1, PD2 and PD3 which are previously stored in the individual parts library 9a.

As described above, in the parts mounting system 1 that the electronic parts of the same parts are supplied from a plurality of venders and used, the electronic parts supplied from a new vender which is not yet registered may possibly sometimes become objects of a loading processing. In this case, when the loading processing is carried out under this state to deliver the electronic parts to the mounting area 3, since the individual parts name PN (i) or the individual parts data PD (i) is not yet registered in the individual parts library 8b or the individual parts library 9a, correct individual parts data PD(i) is not read during the parts mounting work to generate an inconvenience such as a recognition error.

Further, when the tape reel 17 is supplied to the mounting machine 10 in which the parts are out of stock in the mounting area 3, the tape reel 17 supplied from the new vender may be possibly supplied to the mounting area 3 due to any reason without passing a normal registration process. When a proper stock management or control is thoroughly carried out, such a situation does not naturally arise. However, owing to various kinds of reasons located outside a range of assumption, for instance, a plurality of mounting lines 3a the device production makers of which are different are mixed, the electronic parts may be supposed to be supplied to the mounting area 3 from the vender which is not registered. In such a case, the correct individual parts data PD (i) is not read during the parts mounting work to generate the same inconvenience.

Accordingly, in the parts mounting system 1 shown in the present exemplary embodiment, in a parts checking work carried out in a loading and unloading work or the parts mounting work, when the electronic parts the master parts name PN (M) of which is already registered and the individual parts name PN(i) of which is not yet registered in the individual parts library 8b, that is, the electronic parts supplied from the new vender is detected, the vender code VC(i) corresponding to the vender V(i) is applied to the electronic parts to automatically generate the individual parts name PN(i) and the individual parts data PD (i) corresponding to the electronic parts.

Namely, as shown in FIG. 3B, when the vender code VC (the parts maker code) of the electronic part supplied from a new vender "company X" V4 does not correspond to the vender codes VC1, VC2 and VC3 which are already registered in the individual parts library 8b, the master parts data PD(M) stored in the master parts library 8a is reproduced to obtain individual parts data PD4 of the electronic part and further newly generate an addition vender code VC* (here, 4000) formed with a character string different from those of the previously registered vender codes VC1, VC2 and VC3. Generated individual parts name PN4 and individual parts data PD4 are newly registered in the individual parts library Bb as information relating to the electronic part (the master parts name PN(M) is A) supplied from the vender of the "company X" V4.

In an example shown in FIG. 3B, when the parts data PD4 of the electronic part relating to the new individual parts name PN4 (the parts information) is generated, the previously registered master parts data PD(M) corresponding to the master parts name PN(M) (the parts code) is reproduced. However, the individual parts data PD3 relating to the previously registered individual parts name PN(i) (for instance, the individual parts name PN3) may be reproduced which has the same master parts name PN(M).

The above-described automatically generating processing of the parts information is carried out by a processing function of the parts stock management part 4 in a loading stage of the electronic parts. Further, when the parts information needs to be automatically generated in the parts check processing carried out during the supply of the parts in the pats mounting work, the parts information is automatically generated by a processing function of the parts supply work support part 7.

Namely, in the parts mounting system 1 shown in the present exemplary embodiment, for the parts check processing, the individual parts name PN (i) (the parts information) which is the identification information applied to the electronic part and includes the master parts name PN(M) (the parts code) for specifying the part of the electronic part and the vender code (the parts make code) for specifying the vender (the parts maker) of the electronic part is detected in the loading and unloading work of the electronic parts or the parts mounting work by the parts mounting device to check the detected individual parts name PN(i) with the individual parts name PN(i) previously stored and registered in the storing part.

Then, in the parts check processing, when the detected individual parts name PN (i) indicates an unregistered individual parts name PN(i) that the master parts name PN(M) is stored in the storing part and the vender code of the master parts name PN(M) is not stored in the storing part, the individual parts data PD(i) of the electronic part relating to the unregistered individual parts name PN(i) is generated based on the previously registered parts data (the master parts data PD(M) or the individual parts data PD(i)) which has the same master parts name PN(M).

Figure 4:
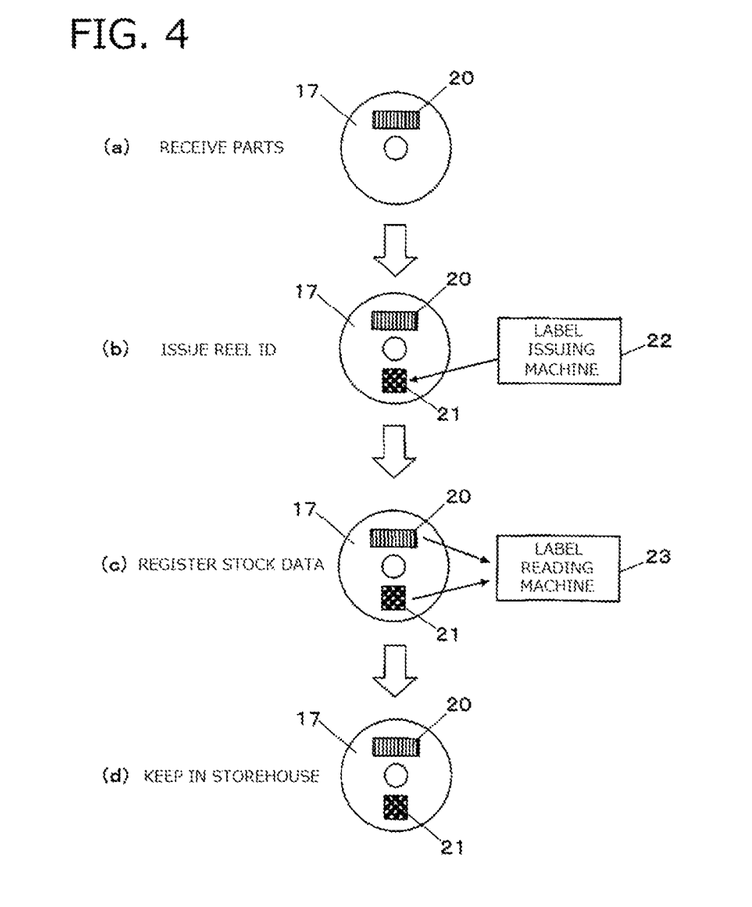
FIG. 4 is an explanatory view of identification information stuck to a reel used for supplying parts in the parts mounting system of the exemplary embodiment of the present invention.

Now, by referring to FIG. 4, the parts loading processing will be described which is carried out by the processing function of the parts stock management parts 4 when the tape reel 17 is received to the parts storage area of the parts mounting system 1. Section (a) of FIG. 4 shows a reception of the parts and the tape reel 17 is received under a state that a parts information label 20 is stuck thereto. To the parts information label 20, information such as the master parts name PN (M), the vender code VC(i) and the number of accommodated parts is coded and applied. As shown in Section (b) of FIG. 4, a reel ID label 21 issued by a label issuing machine 22 is stuck to the received tape reel 17, by an operator. To the reel ID label 21, a reel ID is formed which individually specifies the tape reel 17.

Then, as shown in Section (c) of FIG. 4, stock data is registered. Namely, the operator operates a label reading machine 23 to read the parts information label 20 and the reel ID label 21. Thus, the information such as the master parts name PN (M), the vender code VC(i) or the like is tied to the reel ID of the tape reel 17 and registered in the stock data base of the parts stock management part 4. Then, the tape reel 17 with the information registered in the stock data base is kept in a storehouse in the parts storage area as shown in Section (d) of FIG. 4.

Now, in the parts mounting system 1 having the above-described structure, by referring to below-described drawings respectively, a parts mounting method, will be described below, which mounts the electronic parts supplied from the plurality of parts makers on the board with reference to the previously set parts data. Initially, by referring to FIG. 5, the parts loading processing will be described which is carried out when the tape reel 17 is newly received. This processing is carried out in such a way that the operator reads the parts information label 20 and the reel ID label 21 by the label reading machine 23 (FIG. 4) and carries out a data processing of the read result by the processing function of the parts stock management part 4.

Figure 5:
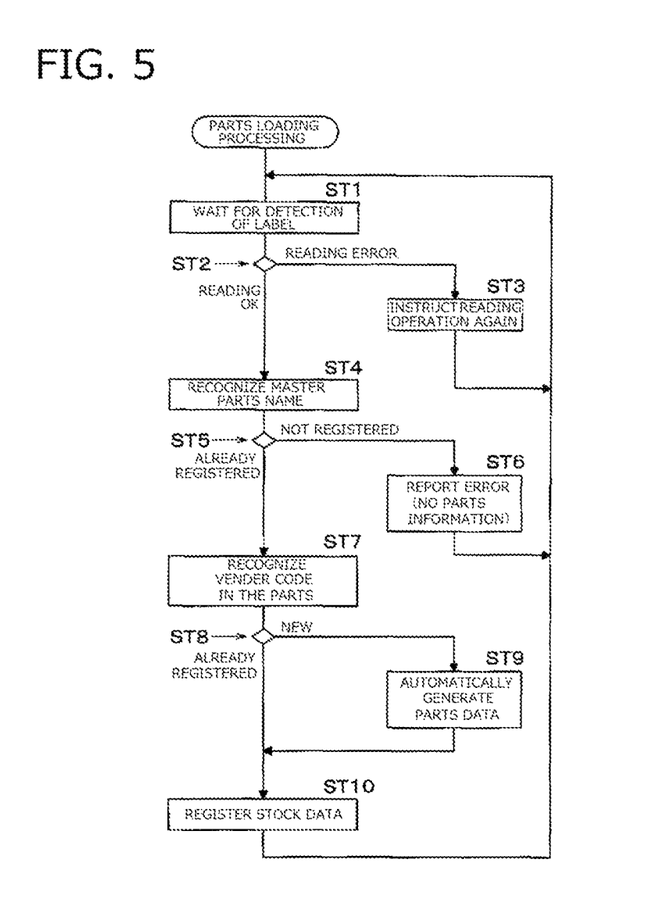
FIG. 5 is a flowchart of a parts loading processing in a parts mounting method of an exemplary embodiment of the present invention.

Initially, a detection of the label is waited for (STEP ST1). Namely, the operator obtains the result got by reading the parts information label 20 and the reel ID label 21 stuck to the tape reel 17 through the label reading machine 23. Here, the parts stock management part 4 decides whether or not a reading operation is OK (Step ST2). When a reading error arises, the parts stock management part 4 instructs the reading operation to be carried out again (Step ST3) and returns to the Step ST1 to wait for the detection of the label. When the reading operation is OK, the parts stock management part 4 recognizes the master parts name PN(M) from the read result of the parts information label 20 (Step ST4). Then, the parts stock management part 4 decides whether or not the master parts name PN(M) is already registered in the storing part (Step ST5). When the master parts name PN(M) is not yet registered in the storing part, the parts stock management part 4 decides that there is no information to report an error (Step ST6) and returns to the Step ST1 to wait for the detection of the label.

In the Step ST5, when the master parts name PN(M) is registered in the storing part, the parts stock management part 4 recognizes the vender code VC(i) in the parts (Step ST7). Then, the stock management part 4 collates the vender code VC (i) with the individual parts name PN(i) which is previously registered in the individual parts library 8b to decide whether or not the vender code VC (i) is already registered (Step ST8). Here, when the vender code VC(i) is already registered, the parts stock management part 4 ties the individual parts name PN(i) read from the parts information label 20 to the reel ID read from the reel ID label 21 and registers them in the stock data base of the parts stock management part 4 (Step ST10) and then, returns to the Step ST1 to wait for the detection of the label.

Further, in the Step ST8, when it is decided that the vender code VC(i) is not yet registered in the storing part and new, the parts data (the individual parts data PD(i)) is automatically generated, which is described in FIG. 3B (Step ST9). Namely, the new addition vender code VC* is applied which is different from the previously registered vender codes and either the master parts data PD(N) or the previously registered individual parts data PD(i) is reproduced to automatically generate new individual parts data PD(i) and store the new individual parts data PD(i) in the individual parts library 8b. Then, after that, the stock data is registered in the same way (Step ST10).

The above-described processing steps respectively form the parts check processing in which the individual parts name PN(i) (the parts information) that is the identification information applied to the electronic parts in the loading work of the electronic parts and includes the master parts name PN(M) (the parts code) for specifying the parts of the electronic parts and the vender code (the parts maker code) for specifying the vender (the parts maker) is detected to collate the detected individual parts name PN(i) with the individual parts name PN(i) which is already registered in the storing part.

Figure 6:
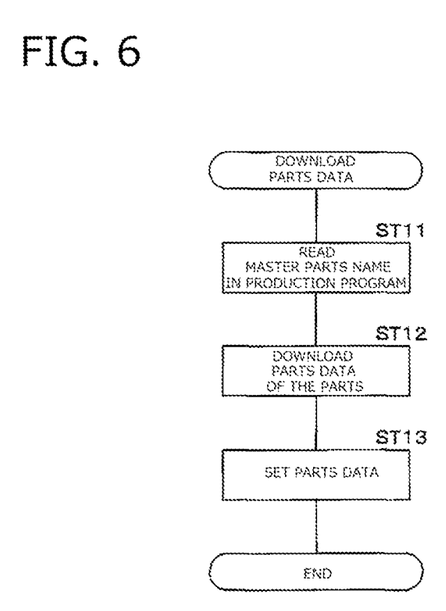
FIG. 6 is a flowchart of a parts data download processing in the parts mounting method of the exemplary embodiment of the present invention.

Now, by referring to FIG. 6, a parts data download processing will described below. This processing is carried out by the mounting machine 10 before the parts mounting work is started, and, carried out by referring to the production program stored in the production information management part 5 and the use parts information controlled or managed by the use parts information management part 6. Initially, in the production program stored in the production information management part 5, the master parts name PN(M) of the electronic parts prescribed as the object to be mounted is read (Step ST11).

Then, the parts data of the parts is downloaded to a storage device of the mounting machine 10 (Step ST12). Here, not only the master parts data PD (M) corresponding to the master parts name PN(M), but also the individual parts data PD(i) corresponding to all the individual parts names PN(i) including the master parts name PN(M) are downloaded as available.

Then, the parts data which is actually used in the parts mounting work is set (Step ST13). Namely, the individual parts data PD(i) of the downloaded parts data which is actually used is set as the parts data which is actually used by referring to the use parts information prescribed in the use parts information management part 6. For instance, when the individual parts name PN(i) of the electronic parts set to the tape feeder 15 attached to a specific arranged position of the feeder as an object from which the parts is taken out is "A-2000", as the individual parts data PD(i) applied to the electronic parts taken out from the feeder arranged position, the individual parts data PD2 corresponding to "A-2000" is set as default parts data.

When not only the parts data download processing, but also a previous preparation necessary for carrying out the parts mounting work is completed, the parts mounting work is carried out by the mounting line 3a. In the parts mounting work, the mounting machines 10 respectively repeat works in which the electronic parts are taken from the carrier tapes 18 drawn out from the tape reels 17 set to the tape feeders 15 by the suction nozzle 13a of the mounting head 13 and mounted on the board 12. At that time, in the operations of the suction, movement and mounting of the electronic parts by the mounting head 13 or a recognition processing of the electronic parts carried out during the operations, the parts data of the electronic parts as the objects of the works is applied to the mounting machines. The mounting machines 10 carry out the operation of the mounting head or the recognition processing based on the applied parts data.

Now, referring to FIG. 7, a supply parts check processing will be described below. This processing is carried out in such a way that data of a result of the reel ID label 21 read by the operator is processed by a processing function of the parts supply work support part 7 in the supply of the parts for supplying a new tape reel 17 in each of the mounting machines 10. Initially, the reel ID is read (Step ST21). Namely, the operator reads the reel ID label 21 stuck to the tape reel 17 by the label reading machine 23. Here, the parts supply work support part 7 decides whether or not the reading operation is OK (Step ST22). When a reading error is shown, the parts supply work support part 7 instructs the reel ID label 21 to be read again (Step ST23). Thus, the parts supply work support part 7 returns to the Step ST21 to carry out the same processing.

Further, when the reading operation is OK, the parts supply work support part 7 detects and checks the master parts name PN(M) included in the parts information label 20 tied to the reel ID label 21 from the read result of the reel ID label 21 (Step ST24). Here, the parts supply work support part 7 refers to the individual parts library 9a to decide whether or not the detected master parts name PN(M) corresponds to the master parts name PN(N) stored in the individual parts library 9a (Step ST25). Then, when both the master parts names PN(M) do not correspond to each other, the parts supply work support part 7 reports that they do not correspond (Step ST26), and then, returns to the Step ST21.

When both the master parts names PN(N) correspond to each other in the Step ST25, the parts supply work support part 7 reports the success of the checking work (Step ST27), and then, checks the individual parts name PN(i) (S28) to decide whether or not the detected individual parts name PN(i) is registered in the storing part (Step ST29). Here, when the individual parts name PN(i) is registered in the storing part, the use parts information is updated (Step ST31). Thus, by the processing function of the use parts information management part 6, is set the use parts information showing that the electronic parts corresponding to the detected individual parts name PN(i) is the electronic parts used in the actual parts mounting work.

Further, in the Step ST29, when it is decided that the individual parts name PN(i) is not yet registered in the storing part and new, the parts data (the individual parts data PD (1)) is automatically generated, which is described in FIG. 3B (Step ST30). Namely, the new vender code VC* is applied which is different from the previously registered vender codes and either the master parts data PD(M) or the previously registered individual parts data PD(i) is reproduced to automatically generate new individual parts data PD (i) and register the new individual parts data PD(i) in the individual parts library 8b. Then, after that, the use parts information is similarly updated (Step ST31).

The above-described processing steps respectively form the parts check processes in which the individual parts name PN(i) (the parts information) that is the identification information applied to the electronic parts in the parts mounting work by the mounting machine 10 and includes the master parts name PN(M) (the parts code) for specifying the parts of the electronic parts and the vender code (the parts maker code) for specifying the vender (the parts maker) is detected to collate the detected individual parts name PN(i) with the individual parts name PN(i) which is already registered in the storing part.

Figure 7:
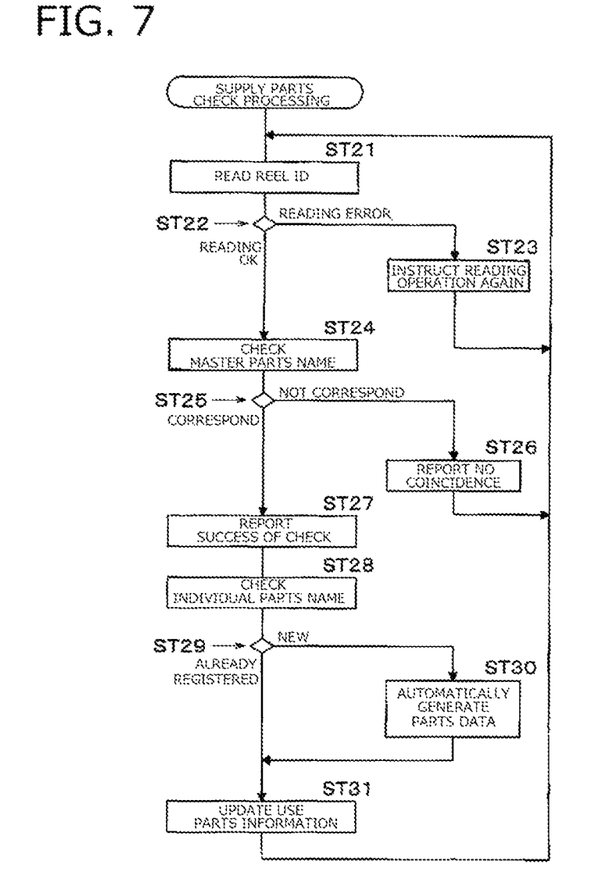
FIG. 7 is a flowchart of a supply parts check processing in the parts mounting method of the exemplary embodiment of the present invention.

Then, in both the parts loading processing shown in FIG. 5 and the supply parts check processing shown in FIG. 7, the processing steps after the above-described parts check processing are parts data generating processing in which when the individual parts name PN(i) detected in the parts check processing is an unregistered individual parts name PN(i) which has the master parts name PN(M) stored in the storing part and the vender code (the parts maker code) of the master parts name PN(M) not stored in the storing part, the individual parts data PD(i) of the electronic parts relating to the unregistered individual parts name PN(i) is generated based on the previously registered parts data having the same master parts name PN(M).

Then, in the parts mounting work by the mounting machine 10, the individual parts data PD(i) which is previously registered and the individual parts data PD(i) which is generated for the unregistered and new individual parts name PN(i) in the parts data generating process are applied to the mounting machine 10 to mount the electronic parts on the board 12. Here, since the newly generated individual parts data PD(i) is reproduced from either of the registered parts data, the electronic parts is not necessarily completely adapted to attributes of the parts depending on a size or an external appearance of the new individual parts name PN(i). Thus, an inconvenience such as a suction error or a recognition error may possibly arise.

In such cases, every time the error is reported, the operator carries out a teaching processing which instructs data relating to the error of the various kinds of parameters in the parts data to be corrected to a proper value. The teaching processing may be merely carried out at a moment when the error is occurred for the newly generated individual parts data PD (i). Thus, working efficiency and capacity utilization can be more improved as compared with the related-art technique in which every time the electronic parts is supplied from the new vender, the parts data needs to be corrected and the equipment needs to be stopped.

Now, referring to FIG. 8, FIGS. 9A and 9B and FIGS. 10A and 10B, a parts data changing processing in the parts mounting system 1 will be described below. This processing indicates a processing when the individual parts data PD(i) of the electronic parts to be delivered is changed from first parts data of preceding parts to second parts data of following parts in the course of continuously delivering to the parts mounting mechanism the two kinds of electronic parts the parts makers of which are different in the mounting machine 10.

Figure 8:
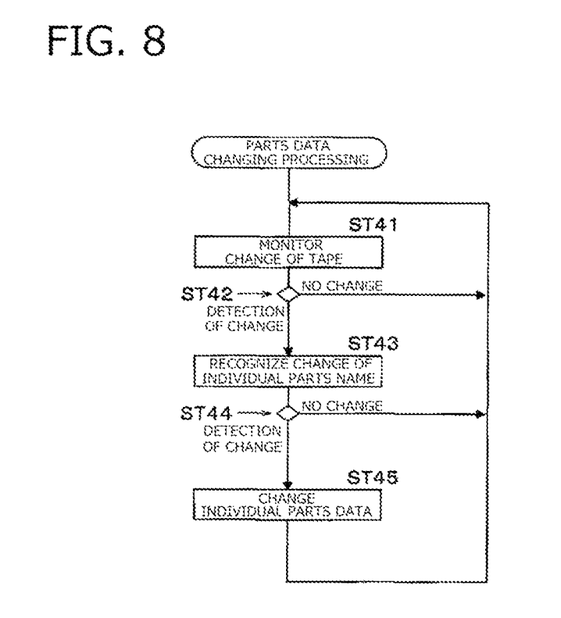
FIG. 8 is a flowchart of a parts data changing processing in the parts mounting method of the exemplary embodiment of the present invention.

Here, there is shown an example of the parts data changing processing in the mounting machine 10 having the tape feeder 15 which delivers the electronic parts held in the carrier tape to the parts mounting mechanism. In the exemplary embodiment, the parts maker of the preceding parts of the above-described two kinds of electronic parts which are pitch fed in advance in feeding the tape is defined as a first parts maker and the parts maker of the following parts which are subsequently pitch fed is defined as a second parts maker. The master parts names PN(M) of the preceding parts and the following parts are the same.

In the tape feeder 15 having such a structure, a tape change part in which the first carrier tape 18(1) which holds the preceding parts supplied from the first parts maker shifts to the second carrier tape 18(2) which holds the following parts supplied from the second parts maker is detected by a sensor built in the tape feeder 15 to detect the change of the parts makers.

In each of the tape feeders 15, a monitoring work of the tape change part for detecting the tape change part of the carrier tape 18 is continuously carried out (Step ST41) to decide whether or not the tape is changed (Step ST42). Namely, in the course of continuously delivering the electronic parts to the parts mounting mechanism in the mounting machine 10, it is detected that the parts maker is changed from the first parts maker of the preceding parts to the second parts maker of the following parts (a parts maker change detecting process).

Figure 9A:
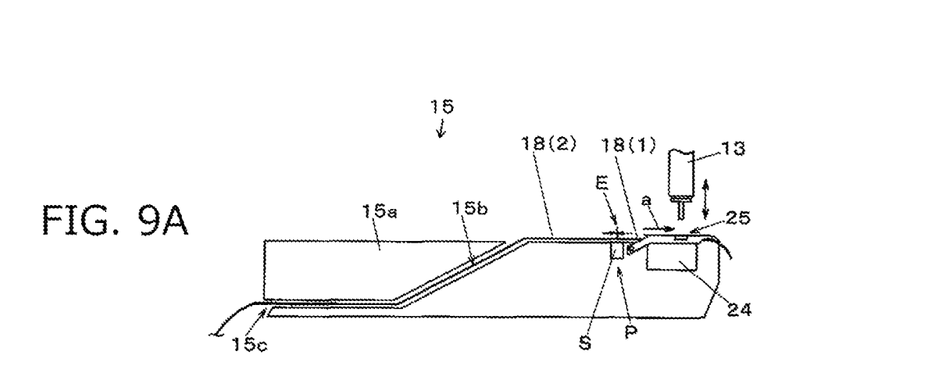
FIGS. 9A and 9B are functional explanatory views of a tape feeder used in the mounting machine arranged in the parts mounting system of the exemplary embodiment of the present invention.
Figure 9B:
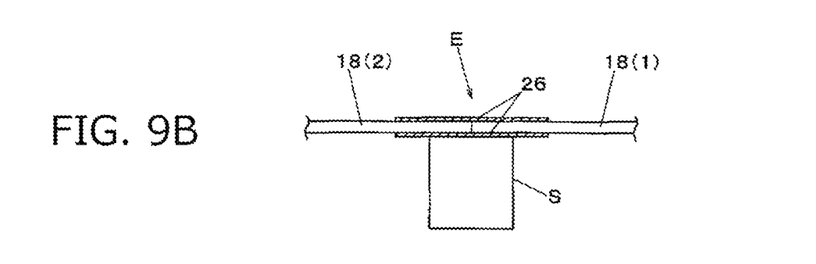

In the present exemplary embodiment, depending on the supply form of the carrier tape 18 when the parts are out of stock, either of two detecting methods of the tape change part shown in FIGS. 9A and 9B and FIGS. 10A and 10B is carried out. In an example shown in FIGS. 9A and 9B, there is shown an example of what is called a splicing system that a terminal end part of the first carrier tape 18(1) is previously joined to an end part of the following second carrier tape 18(2) before the preceding first carrier tape 18(1) is completely consumed. In this example, as shown in FIG. 9B, a splicing tape 26 is stuck so as to stride over the terminal end part of the first carrier tape 18(1) and the end part of the second carrier tape 18(2), so that a joint part E in which both the tapes are integrally spliced together is formed.

When the carrier tape 18 is fed to the tape feeder 15, the carrier tape 18 introduced from a tape introducing opening 15c provided in a rear end part of a feeder main body part 15a is pitch fed forward (an arrow mark a) along a tape running path 15b by a tape feed mechanism 24. The electronic parts are taken out at a parts suction position 25 by the mounting head 13. In a detecting position P set in an upstream side of the parts suction position 25, a joint part detecting sensor S which optically detects the joint part E is arranged.

In the process where the first carrier tape 18(1) and the second carrier tape 18(2) are pitch fed integrally, when the joint part E reaches the detecting position P, the joint part E is detected by the joint part detecting sensor S. Thus, it is detected that the tape change part in which the first carrier tape 18(1) shifts to the second carrier tape 18(2) reaches the detecting position P. In this structure, the joint part detecting sensor S serves as a tape change part detecting unit for detecting the tape change part.

Figure 10A:
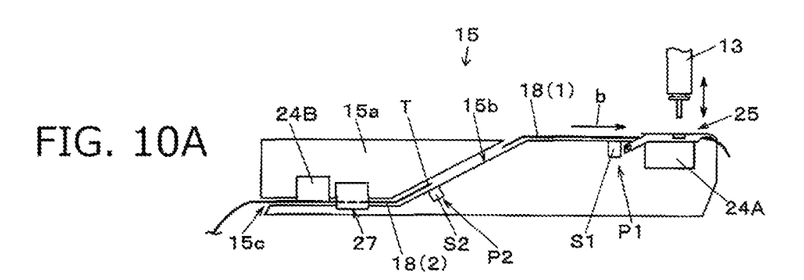
FIGS. 10A and 10B are functional explanatory views of the tape feeder used in the mounting machine arranged in the parts mounting system of the exemplary embodiment of the present invention.
Figure 10B:
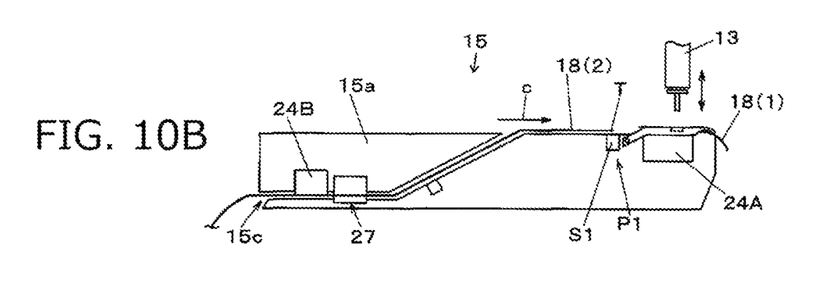

An example shown in FIGS. 10A and 10B illustrate a detecting example of a tape change part in a splicing less system that the first carrier tape 18(1) is not previously joined to the second carrier tape 18(2). In this example, the tape feeder 15 includes individually a first tape feed mechanism 24A which pitch feeds the preceding first carrier tape 18(1) and a second tape feed mechanism 24B which pitch feeds the following second carrier tape 18(2). Further, the tape feeder 15 includes a tape stop mechanism 27 which temporarily stops the second carrier tape 18(2) inserted from the tape introducing opening 15c under a state that the second carrier tape 18(2) is overlapped on the first carrier tape 18(1) until the first carrier tape 18(1) is firstly separated from the second carrier tape 18(2).

In a first detecting position P1 set in an upstream side of the parts suction position 25 and a second detecting position P2 set in a downstream side of the tape stop mechanism 27, a first tape detecting sensor S1 and a second tape detecting sensor S2 are arranged which detect end parts of the first carrier tape 18(1) and the second carrier tape 18(2). Based on the detected results of the first tape detecting sensor S1 and the second tape detecting sensor S2, the first tape feed mechanism 24A and the second tape feed mechanism 24B are controlled. Thus, the first carrier tape 18(1) and the second carrier tape 18(2) can be sequentially pitch fed at a prescribed tape feed timing.

Specifically, when the preceding first carrier tape 18(1) is pitch fed by the first tape feed mechanism 24A (an arrow mark b) and the end part (the terminal end part) thereof is detected by the first tape detecting sensor S1, the tape stop mechanism 27 is released and the second carrier tape 18(2) begins to be conveyed by the second tape feed mechanism 24B. When the end part T of the second carrier tape 18(2) is detected by the second tape detecting sensor S2, the tape feed mechanism 24B temporarily stops a conveying operation of the second carrier tape 18(2) (FIG. 10A).

Then, after that, when the end part (the terminal end part) of the first carrier tape 18(1) is detected by the first tape detecting sensor S1, the conveying operation of the second carrier tape 18(2) by the second tape feed mechanism 24B is resumed and the second carrier tape 18(2) is conveyed (an arrow mark c) until the end part T reaches the first detecting position P1 and is detected by the first tape detecting sensor S1 (FIG. 10B). After that, when the first carrier tape 18(1) is discharged, the second carrier tape 18(2) is pitch fed to the parts suction position 25 to complete the change of the carrier tape.

In this structure, the end part T of a top side of the second carrier tape 18(2) corresponds to the tape change part in which the first carrier tape 18(1) is shifted to the second carrier tape 18(2). In the structure, the first tape detecting sensor S1 and the second tape detecting sensor S2 serve as tape change part detecting units which detect the tape change part.

As described above, when an occurrence of the tape change is detected in the Step ST42, the change of the individual parts name is recognized (Step ST43). In the supply of the parts, the electronic parts are not necessarily continuously and constantly supplied from the same parts maker and the electronic parts in which only the master parts name PN(M) is common and the individual parts names PN(i) are different may be sometimes possibly mixed and supplied. In such a case, the individual parts data PD(i) needs to be used which corresponds to the electronic parts as the objects of the parts mounting work. Accordingly, every time the occurrence of the tape change part is detected, in order to recognize that the parts data needs to be changed, the individual parts name PN(i) detected from the reel ID read in the (Step ST21) of the supply parts check processing shown in FIG. 7 is compared with the use parts information managed by the use parts information management part 6 to decide whether or not the parts data needs to be changed (Step ST44).

Here, when it is decided that the parts data needs to be changed, the individual parts data is changed (Step ST45). Namely, when it is detected that the parts maker is changed, the individual parts data PD(i) (second parts data) corresponding to the individual parts name PN(i) of following parts supplied from a second parts maker is read from the storing part (a parts data reading process). When it is decided that the occurrence of the tape change is not detected in the Step ST42, when it is decided that the parts data does not need to be changed in the Step ST44) and after the changing process of the individual parts data is finished in the Step ST45, the procedure is respectively returned to the Step ST41 to carry out the processing after that in the same manner.

Then, the parts mounting mechanism of the mounting machine 10 refers to the read individual parts data PD(i) (the second parts data) to carry out the parts mounting work of the following parts (a parts mounting process). Thus, even when a plurality of kinds of electronic parts the individual parts data of which is different are continuously supplied, the correct individual parts data corresponding to the electronic parts can be applied to carry out the parts mounting work.

As described above, in the parts mounting system and the parts mounting method shown in the present exemplary embodiment, in the parts check processing, the individual parts name PN (i) (the parts information) which is the identification information applied to the electronic parts and includes the master parts name PN(M) (the parts code) for specifying the parts of the electronic parts and the vender code VC (the parts make code) for specifying the vender as the parts maker of the electronic parts is detected to check the detected individual parts name PN(i) with the individual parts name PN(i) previously stored and registered in the storing part. In the parts check processing, when the detected individual parts name PN(i) indicates an unregistered individual parts name PN(i) that the master parts name PN(M) is stored in the storing part and the vender code VC of the master parts name PN(M) is not stored in the storing part, the individual parts data PD(i) of the electronic parts relating to the unregistered individual parts name PN(i) is generated based on the previously registered parts data PD(i) which has the same master parts name PN(M) for application of data.

Thus, even if the electronic parts having the same master parts name PN(M) and supplied from different parts makers are included as the objects to be mounted, when the new electronic parts supplied from the different parts makers are used, the previously registered parts data having the same parts code is used to automatically generate the parts data. Thus, the parts data does not need to be previously prepared, so that the change or the new adoption of the parts maker can be rapidly and assuredly dealt with. Especially, when the parts are continuously fed, for instance, when the tape feeder is used to feed the parts, a prominent effect is exhibited.

Namely, as described above, even when the plurality of kinds of electronic parts having the different parts data are continuously fed, the correct individual parts data corresponding to the electronic parts is automatically generated. Accordingly, every time the change of the parts maker is detected, the correct individual parts data corresponding to the following parts after the change of the parts maker can be applied to carry out the parts mounting work.

The parts mounting system and the parts mounting method of the exemplary embodiment of the invention have an effect that a change or a new adoption of a parts maker can be rapidly and assuredly dealt with even in a production site for mounting parts where electronic parts which are the same parts and the parts makers of which are different are mixed. Further, the parts mounting system and the parts mounting method are applicable to a field where the electronic parts supplied from a plurality of parts makers are mounted on a board by referring to previously stored parts data.

What is claimed is:

1. A parts mounting system that mounts electronic parts including a first part and a second part supplied from a plurality of parts makers on a board by referring to previously stored parts data, the system comprising:
   a parts check processing section that, in a loading work of the electronic parts or a parts mounting work by a parts mounting device, detects parts information which is identification information applied to an electronic part and includes a parts code for specifying a part of the electronic part and a parts maker code for specifying a parts maker of the electronic part and checks the detected parts information with parts information previously registered in a storing part;
   wherein the first part has a parts code and a parts maker code, and the second part has a parts code and a parts maker code; and
   a parts data generation section that, when the parts maker code of the first part is stored and registered on a first storing part and when the parts maker code of the second part is not stored and registered on a second storing part and the parts code of the second part is identical to the parts code of the first part, generates the parts maker code of the second part from parts data of the first part by reading the parts code of the second part,
   wherein the generated parts maker code of the second part is newly registered and stored on the second storing part as information relating to the electronic parts.

2. The parts mounting system according to claim 1, wherein when the parts data of the electronic part relating to the parts maker code of the second part that is not registered and the parts code of the second part that is registered is generated, the parts data generation section reproduces previously registered master parts data corresponding to the parts code.

3. The parts mounting system according to claim 1, wherein when the parts data of the electronic part relating to the parts maker code of the second part that is not registered and the parts code of the second part that is registered is generated, the parts data generation section reproduces the parts data of previously registered parts information having the same parts code.

4. A parts mounting method that mounts electronic parts including a first part and a second part supplied from a plurality of parts makers on a board by referring to previously set parts data, the parts mounting method comprising:

in a loading work of the electronic parts or a parts mounting work by a parts mounting device, detecting parts information which is identification information applied to an electronic part and includes a parts code for specifying a part of the electronic part and a parts maker code for specifying a parts maker of the electronic part and checking the detected parts information with the parts information previously registered and stored in a storing part;

wherein the first part has a parts code and a parts maker code, and the second part has a parts code and a parts maker code;

when the parts maker code of the first part is stored and registered on a first storing part and when the parts maker code of the second part is not stored and registered on a second storing part and the parts code of the second part is identical to the parts code of the first part, generating the parts maker code of the second part from parts data of the first part by reading the parts code of the second part; and mounting the electronic parts on the board with the parts mounting device to which the previously registered parts data and the generated parts data are applied, wherein the generated parts maker code of the second part is newly registered and stored on the second storing part as information relating to the electronic parts.

5. The parts mounting method according to claim 4, wherein when the parts data of the electronic part relating to the parts maker code of the second part that is not registered and the parts code of the second part that is registered is generated, previously registered master parts data corresponding to the parts code is reproduced.

6. The parts mounting method according to claim 4, wherein when the parts data of the electronic part relating to the parts maker code of the second part that is not registered and the parts code of the second part that is registered is generated, the parts data of previously registered parts information which has the same parts code is reproduced.

* * * * *